United States Patent
Zhang et al.

(10) Patent No.: US 7,495,496 B2
(45) Date of Patent: Feb. 24, 2009

(54) METHOD AND CIRCUIT FOR PRODUCING SPREAD SPECTRUM AND/OR OVER CLOCK SIGNAL

(75) Inventors: Peng-Zhan Zhang, JiangSu (CN); Li-Jun Gu, JiangSu (CN); Ran Ding, JiangSu (CN)

(73) Assignee: Realtek Semiconductor Corp., HsinChu (TW)

( * ) Notice: Subject to any disclaimer, the term of this patent is extended or adjusted under 35 U.S.C. 154(b) by 53 days.

(21) Appl. No.: 11/477,531

(22) Filed: Jun. 30, 2006

(65) Prior Publication Data

US 2007/0001882 A1    Jan. 4, 2007

(30) Foreign Application Priority Data

Jul. 1, 2005    (TW)    .............................. 94122365 A (51) Int. Cl.
  *G06F 1/04*    (2006.01)
(52) U.S. Cl. ........................ 327/291; 327/293; 327/117; 327/119
(58) Field of Classification Search ................. 327/291, 327/293, 294, 297–299, 115–117, 119
  See application file for complete search history.

(56) References Cited

U.S. PATENT DOCUMENTS

| | | | | |
|---|---|---|---|---|
| 5,651,035 | A | * | 7/1997 | Tozun et al. ................. 375/373 |
| 6,046,646 | A | * | 4/2000 | Lo et al. ........................ 331/10 |
| 6,294,936 | B1 | * | 9/2001 | Clementi ..................... 327/156 |
| 6,351,485 | B1 | | 2/2002 | Soe et al. |
| 6,603,360 | B2 | * | 8/2003 | Kim et al. .................... 331/1 A |
| 6,628,153 | B2 | * | 9/2003 | Inoue .......................... 327/156 |
| 6,914,464 | B2 | * | 7/2005 | Maeda ......................... 327/156 |
| 6,927,716 | B2 | * | 8/2005 | Keaveney et al. ........... 341/143 |
| 6,952,125 | B2 | * | 10/2005 | Ahn et al. .................... 327/156 |
| 7,054,404 | B2 | * | 5/2006 | Saeki .......................... 375/376 |
| 7,075,383 | B2 | * | 7/2006 | Adachi et al. ............... 332/127 |

* cited by examiner

*Primary Examiner*—Lincoln Donovan
*Assistant Examiner*—Hai L. Nguyen
(74) *Attorney, Agent, or Firm*—Winston Hsu (57) ABSTRACT

The present invention is to provide a method and circuit for producing spread spectrum and over clock, which includes a primary circuit and a secondary circuit, wherein the primary circuit uses a frequency division technique based on phase swallow to achieve a high frequency resolution clock signal, and the secondary circuit multiplies the frequency of the output clock signal of the primary circuit, so as to expand its frequency range.

27 Claims, 7 Drawing Sheets

METHOD AND CIRCUIT FOR PRODUCING SPREAD SPECTRUM AND/OR OVER CLOCK SIGNAL

FIELD OF THE INVENTION

The present invention relates to electronic circuit, and more particularly to a frequency modulation electronic circuit.

BACKGROUND OF THE INVENTION

In recent years, a huge demand for high-speed electronic devices creates an Electromagnetic Interference (EMI) issue in the applications of circuits and components. Since high speed electronic devices work under the condition of a high operating frequency relatively increase the level of electromagnetic interference, therefore a way of increasing the operating speed of a circuit while effectively lowering the electromagnetic interference demands immediate attentions and becomes a major issue to the circuit designers and manufacturers.

The prior art designs for resisting electromagnetic interference are mainly divided into the following two types:

1. Filtering Signals with High Electromagnetic Interference

It is rather impractical to filter the signals having high electromagnetic interference if it is necessary to operate in such a high operating frequency, since such arrangement also lowers the overall system performance. Although adding a metal shielding can reduce the high electromagnetic interference to a certain extent, yet its cost is too high for general practices.

2. Lowering Peak Energy of Clock Signal

Figure 1:
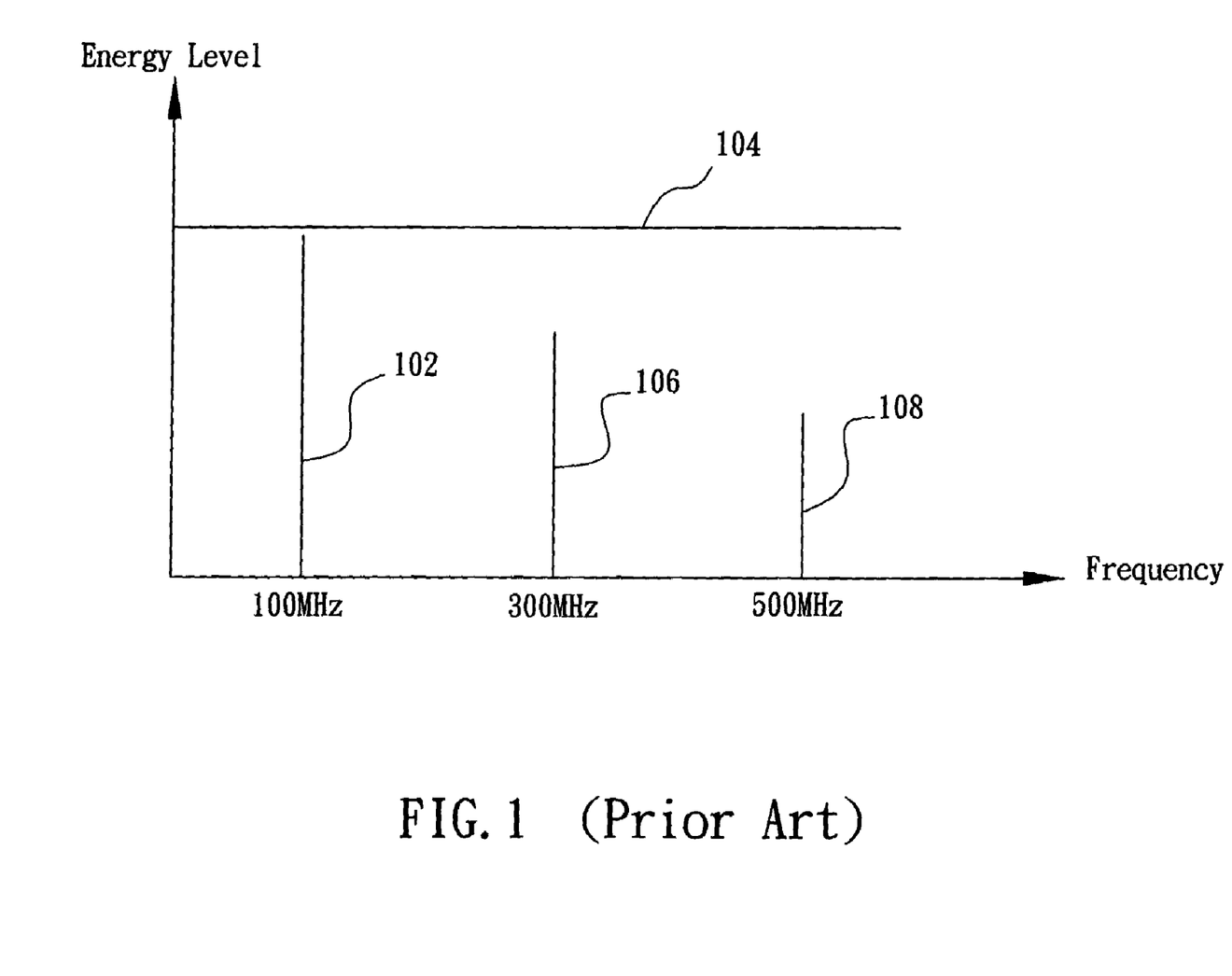
FIG. 1 is a schematic view of an energy waveform of a standard clock signal.

The Frequency Modulation (FM) technology is used for lowering the peak energy in a clock signal. A standard clock signal is adopted for example. Referring to FIG. 1, a signal 102 indicates that when the energy level of a clock signal at a fundamental frequency is 100 MHz, the energy level is very close to the energy limit 104 specified by the Federal Communication Committee (FCC), and a signal 106 indicates that the energy level of a clock signal at a third harmonic frequency (3rd Harmonic) is 300 MHz, and a signal 108 indicates that the energy level of a clock signal at a fifth harmonic frequency (5th Harmonic) is 500 MHz.

Figure 2:
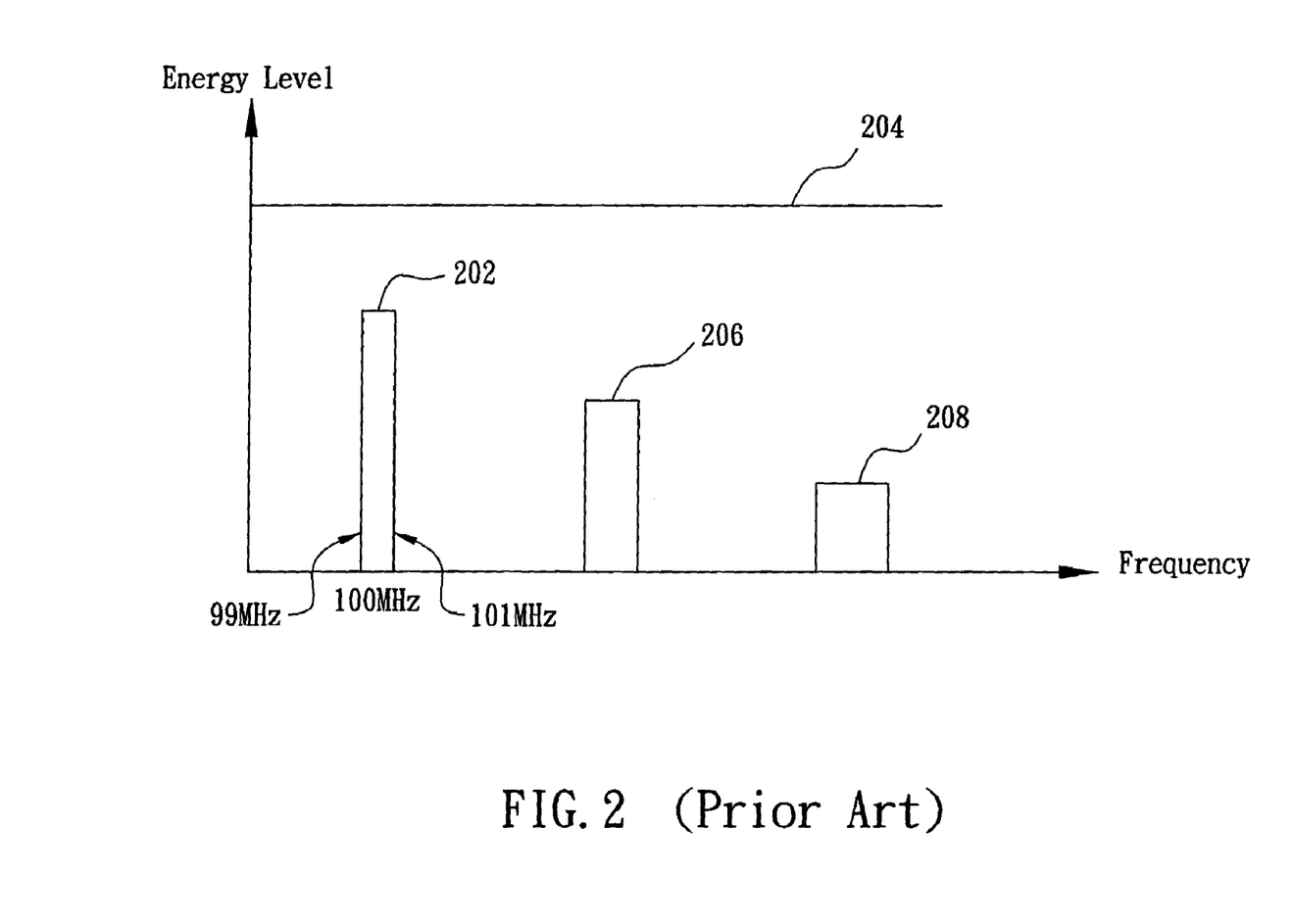
FIG. 2 is a schematic view of an energy waveform of a standard clock signal as depicted in FIG. 1 after a frequency modulation is carried out.

However, after a frequency modulation is processed for the clock signal as shown in FIG. 1, the signal 102 is modulated to the signal 202 as shown in FIG. 2. The energy level of the signal 202 at the fundamental frequency is 100 MHz, and its frequency ranges from 99 MHz to 101 MHz, so that the energy level of the signal 202 is far below the energy limit 204 specified by the FCC. The signal 106 is modulated to the signal 206 as shown in FIG. 2. The energy level of the signal 206 at the third harmonic frequency is 300 MHz, and its frequency ranges from 297 MHz to 303 MHz. The signal 108 is modulated to the signal 208 as shown in FIG. 2. The energy level of the signal 208 at the fifth harmonic frequency is 500 MHz, and its frequency ranges from 495 MHz to 505 MHz. In FIGS. 1 and 2, the spectrum of the clock signal will be spread over after the frequency of the clock signal is modulated, and its spectrum is spread over within a wider frequency range to effectively lower its peak energy.

It is worth to point out that a very accurate modulation for the clock signal is needed; otherwise the center frequency of the modulated clock signal will be deviated far from the center frequency of the original clock signal. As a result, the recipient circuitry may be unable to operate normally due to the timing issue.

Sometimes users want to speed up their system to the greatest extent, they need the frequency of the system clock to be higher, so over clock is needed. In order to make the system work normally during over clock process and reach frequency as high as it can, it needs:

a. The over clock range must be large;

b. The clock frequency changes linearly, and the clock can maintain good performance during the over clock process;

c. There is no frequency overshoot at the end of the over clock process.

The prior art designs to produce spread spectrum and over clock are mainly divided into the following two types:

1. Using Integer Frequency Divider Charge Pump Phase Locked Loop

Figure 3:
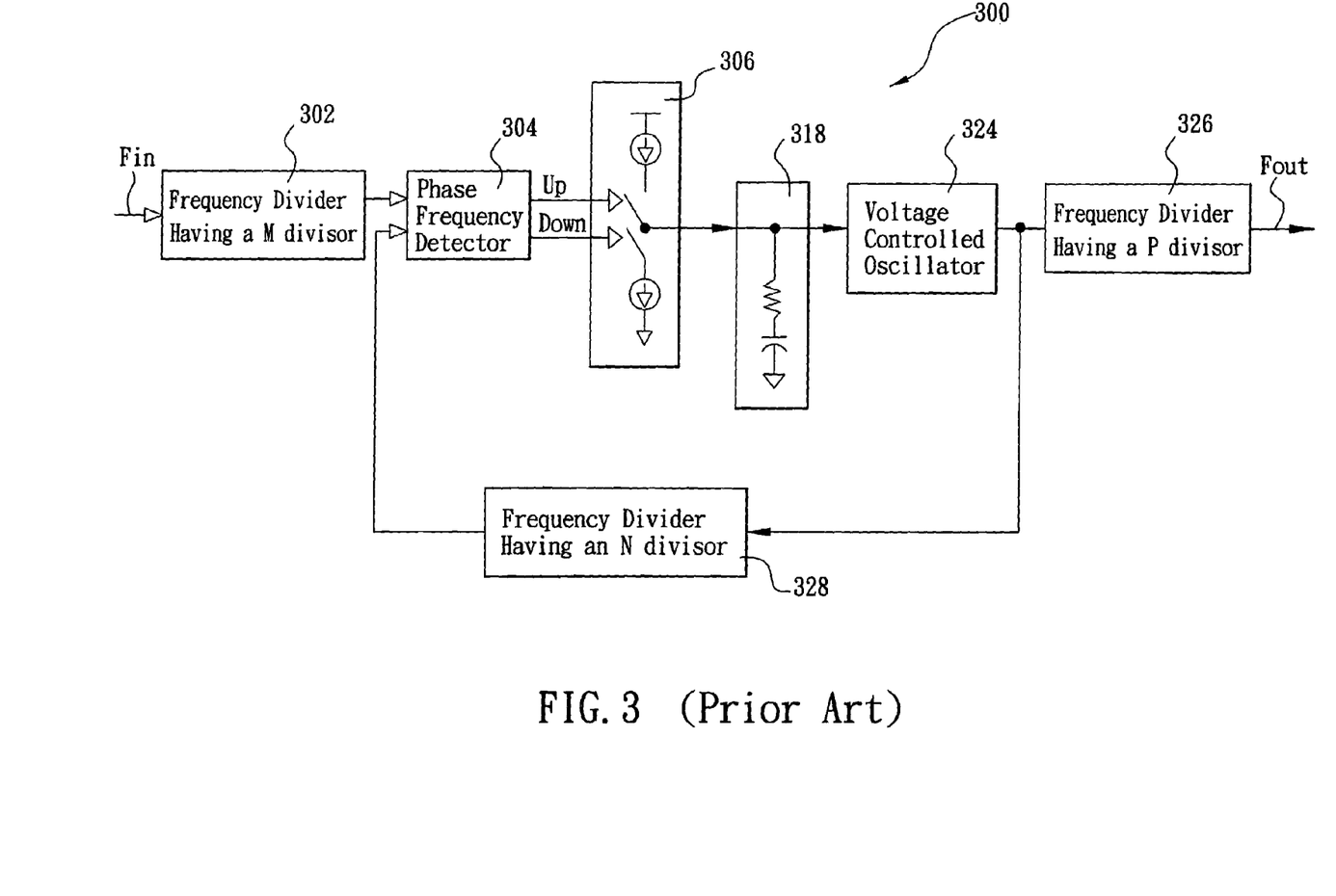
FIG. 3 is a schematic view of a circuitry of a prior art integer frequency divider charge pump phase locked loop.

In recent years, an "integer frequency divider charge pump phase locked loop (PLL)" circuit is widely used in various different electronic devices for providing an accurate clock signal. Refer to FIG. 3 for a prior art integer frequency divider charge pump phase-locked loop 300, a divider 302 having a M divisor, a phase frequency detector (PFD) 304, a charge pump (CP) 306, a loop filter 318, a voltage controlled oscillator (VCO) 324, a divider 326 having a P divisor and a divider 328 having an N divisor.

The value of frequency of the output clock signal $F_{out}$ of the integer frequency divider charge pump phase-locked loop 300 is equal to the multiplication of the input clock signal $F_{in}$ and an N/(M×P) factor. Although the circuitry of such prior art integer frequency divider charge pump phase locked loop 300 provides a larger frequency range for the output clock signal $F_{out}$, the following shortcomings still exist, particularly for the high-speed electronic devices that use a higher frequency to achieve synchronization:

a. Since the factor M of the divider 302 is increased, the bandwidth of the phase locked loop 300 is decreased and its locking time is increased, and it cannot achieve high frequency resolution.

b. Overcharge occurs when the over clock ends.

c. The frequency change is nonlinear during the over clock process and thus causing excessively large phase noises and jitters or probably causing a system failure for receiving and using the clock signal at later stages.

2. Using Decimal Frequency Division Phase Locked Loop

Figure 4:
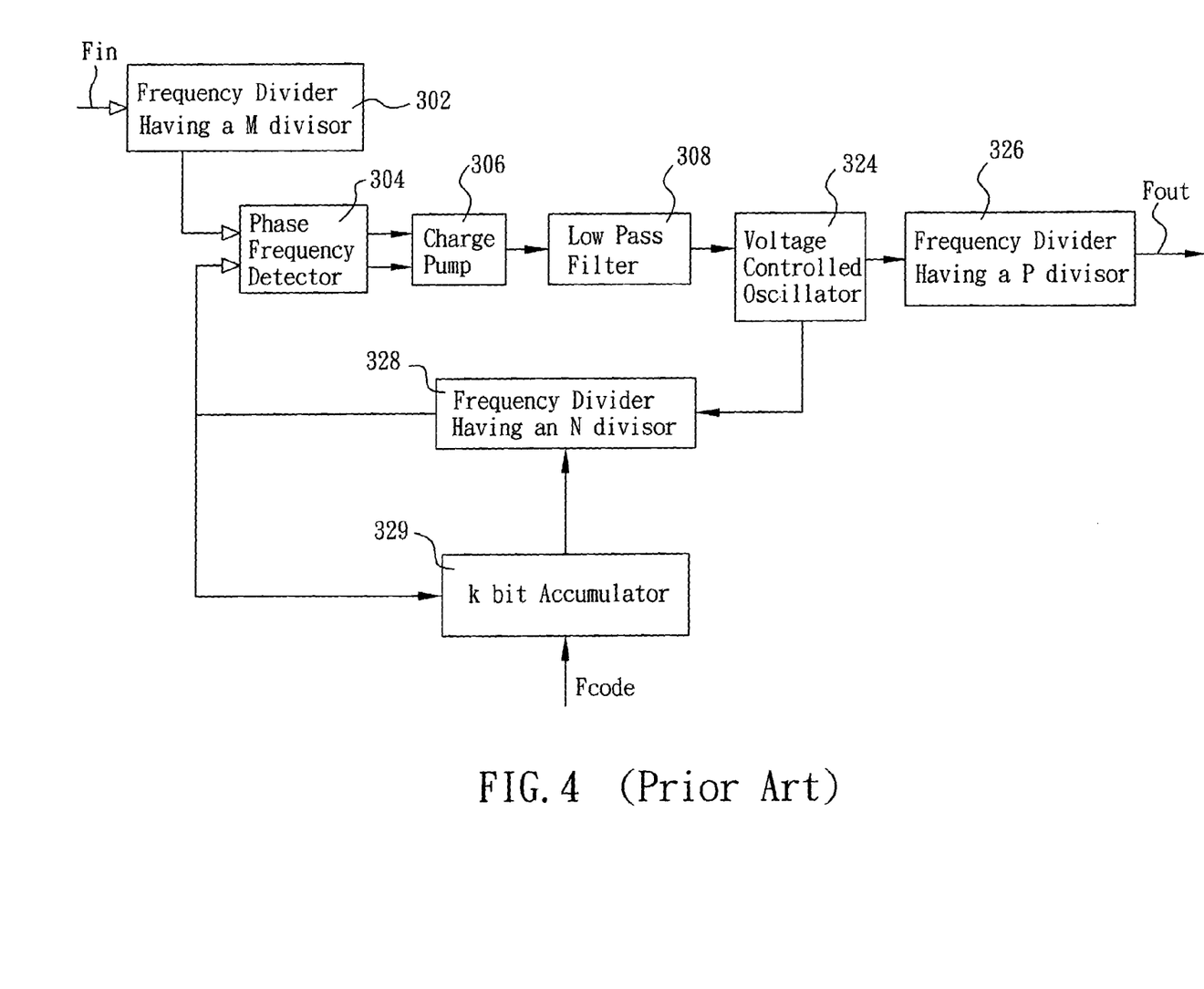
FIG. 4 is a schematic view of a circuitry of a prior art decimal frequency division phase-locked loop.

Referring to FIG. 4 for the prior art decimal frequency division phase locked loop, its circuitry is the same as the foregoing prior art integer frequency divider charge pump phase locked loop, except it has an additional K Bit accumulator 329 for controlling its N frequency divider to select the divisor factor as N or N−1 according to the input reference signal f to make the value of the frequency of its output clock signal $F_{out}$ equal to $$F_{in} \times N \times \frac{\left(1 + \frac{f}{2^k}\right)}{M \times P}.$$

Although the prior art decimal frequency division phase locked loop can achieve the high-frequency resolution and assure a wider bandwidth of the phase locked loop, yet it still has the following shortcomings:

a. The PLL has a narrow range of the output frequency.

b. A spur of decimal frequency division exists, and thus easily deteriorating phase noises.

SUMMARY OF THE INVENTION

A primary objective of the present invention is to provide a circuit for producing spread spectrum and over clock.

Another objective of the present invention is to achieve an overcharge-free over clock and frequency linearity during the over clock processing.

A further objective of the present invention is to achieve a wide frequency range for producing spread spectrum and over clock.

Another further objective of the present invention is to achieve a low jitter and low phase noise output clock during spread spectrum and/or over clock processing.

A further objective of the present invention is to achieve a high frequency resolution during over clock processing.

The above and other objects, features and advantages of the present invention will become apparent from the following detailed description taken with the accompanying drawings.

DETAILED DESCRIPTION OF THE PREFERRED EMBODIMENTS

Figure 5:
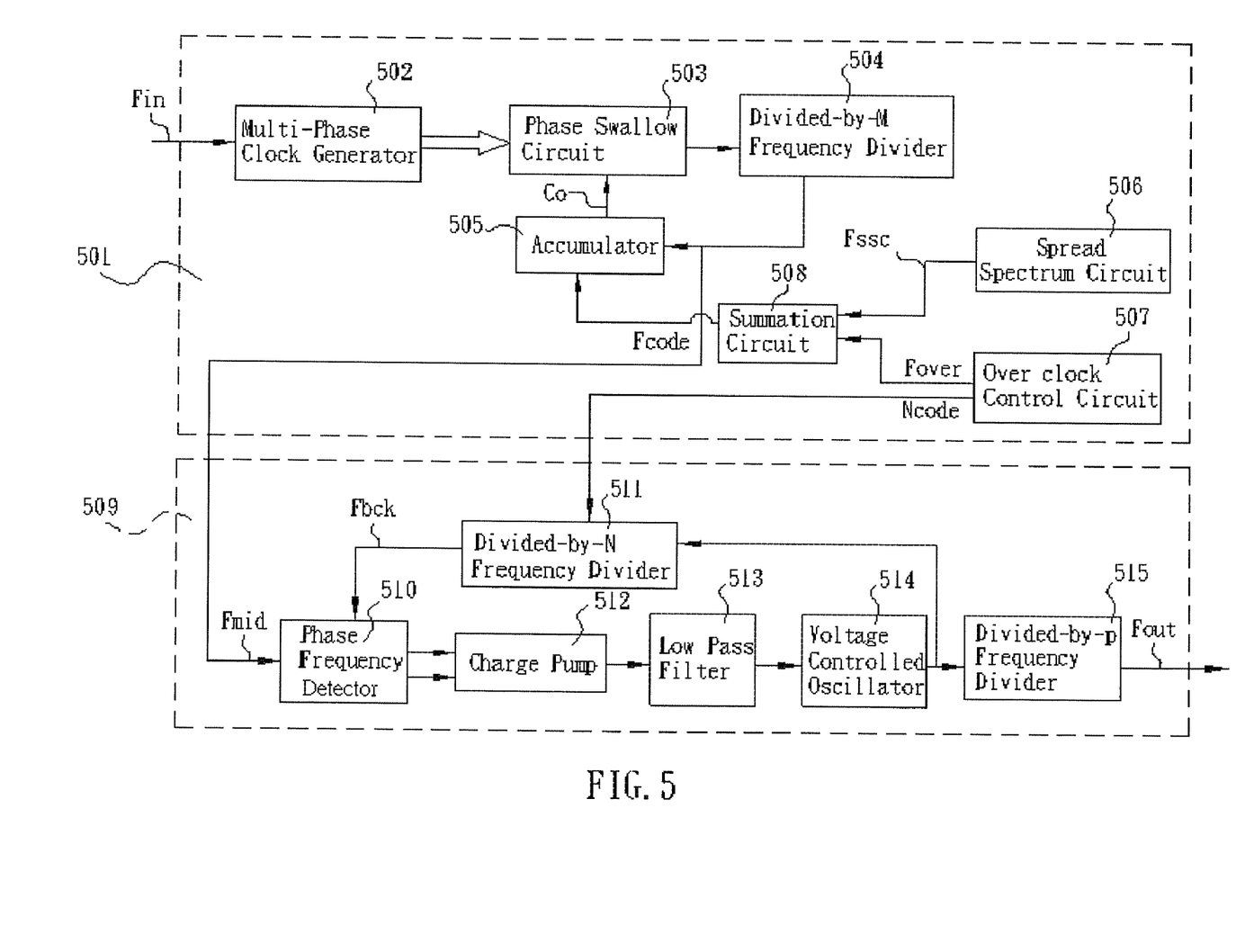
FIG. 5 is a schematic view of a circuitry of producing spread spectrum and over clock according to the present invention.

Referring to FIG. 5 for the method and circuit of producing spread spectrum and over clock, its circuitry comprises a primary circuit 501 and a secondary circuit 509. In an embodiment, the primary circuit 501 uses a phase swallow technique to implement a fractional frequency divider with high frequency resolution, and then send the output clock signal $F_{mid}$ to the secondary circuit 509. The secondary circuit 509 is a phase locked loop to multiply the frequency of the clock signal $F_{mid}$, so as to expand its frequency range. As a result, when the circuit is used for spread spectrum, it only needs to change the input signal $F_{code}$ of an accumulator 505 included in the primary circuit 501, so that the input reference clock signal $F_{in}$ of the primary circuit 501 completes a processing similar to a fractional frequency division, and the secondary circuit 509 is a phase locked loop that carries out a frequency multiplication to the input clock signal $F_{mid}$. When the circuit is used for over clock, it needs a wide frequency range, so the divisor factor N (frequency division ratio) of a programmable feedback frequency divider 511 in the secondary circuit 509 must be changed. To assure continuous linearity for the frequency changing during the over clock process, the circuit uses a dynamic phase compensation technique. The input signal $F_{code}$ of the accumulator 505 is added an appropriate DC offset when the divisor factor N is changed, so no phase error exists between the two input signals $F_{bck}$ and $F_{mid}$ of a phase frequency detector (PFD) 510 of the secondary circuit 509. This technique assures low jitter and low phase noise for the output clock signal $F_{out}$.

Referring to FIG. 5 for a preferred embodiment of the present invention, the primary circuit 501 comprises a multi-phase clock generator 502, a phase swallow circuit 503, a divided-by-M divider 504, an accumulator 505, a spread spectrum control circuit (SSC) 506, an over clock control circuit 507, and a summation circuit 508. The multi-phase clock generator 502 receives an input reference clock signal $F_{in}$, and produces multi-phase clock signals that is sent to a phase swallow circuit 503. The output signal of the phase swallow circuit 503 is sent to the divided-by-M divider 504, and then the divider 504 sends its output clock signal ($F_{mid}$) to the accumulator 505. The spread spectrum control circuit 506 produces a spread spectrum control data ($F_{ssc}$). The over clock control circuit 507 which implement an automatic over clock according to a user setup produces an over clock control data ($F_{over}$) and a divisor factor control data ($N_{code}$). The control data $F_{ssc}$ and $F_{over}$ are both sent to a summation circuit 508 (such as an adder), and the summation circuit 508 will send a summation control data ($F_{code}$) to an accumulator 505. The carryout signal $C_0$ produced by the accumulator 505 can be used as another input signal of a phase swallow circuit 503. The carryout signal $C_0$ to the phase swallow circuit 503 controls the numbers of swallowed phases. The above circuits complete a process similar to fractional frequency division to the input reference clock signal $F_{in}$ of the primary circuit 501. The accumulator 505 can be a sigma-delta modulator for better low frequency phase noise performance.

Referring to FIG. 5 for the preferred embodiment of the present invention, the secondary circuit 509 can be a phase locked loop circuit comprising a phase frequency detector (PFD) 510, a programmable feedback frequency divider 511, a charge pump (CP) 512, a filter 513, a voltage controlled oscillator (VCO) 514, and a divided-by-P frequency divider 515. There are two input signals of the PFD 510, one is the processed clock signal $F_{mid}$ of the primary circuit 501 and the other is the output signal of the programmable feedback frequency divider 511. The divisor factor of the programmable feedback frequency divider 511 is set by the divisor factor control data $N_{code}$ from the over clock control circuit 507. The phase error signal produced by the phase frequency detector 510 is sent to the charge pump (CP) 512 and is filtered by the filter 513. The output voltage signal from the filter 513 is sent to a voltage-controlled oscillator (VCO) 514. The output clock of the VCO is sent to the programmable feedback frequency divider 511, and it is also used as the input signal of the divided-by-P frequency divider 515. The divided-by-P frequency divider 515 produces the final required output clock signal $F_{out}$.

In the actual operating process of the preferred embodiment, the over clock control circuit 507 controls the divisor factor data $N_{code}$ of the programmable feedback frequency divider 511 according to the user setup, and outputs the control data $F_{over}$ to the accumulator 505. The over clock process follows the formula as given below:

$$F_{code} = F_{ssc} + F_{over}$$

$$F_{out} = F_{in} \times \frac{N}{\left(1 + \frac{F_{code}}{2^k \times PH}\right) \times M \times P}$$

Where, PH stands for the total phase number of the multi-phase clock generators 502. Therefore, as the value of the signal $F_{code}$ is decreased gradually, the frequency value of the output clock signal $F_{out}$ is increased, and its frequency resolution is given below:

$$\text{Resolution} = F_{in} \times \frac{N}{2^k \times PH \times M \times P}$$

Figure 6:
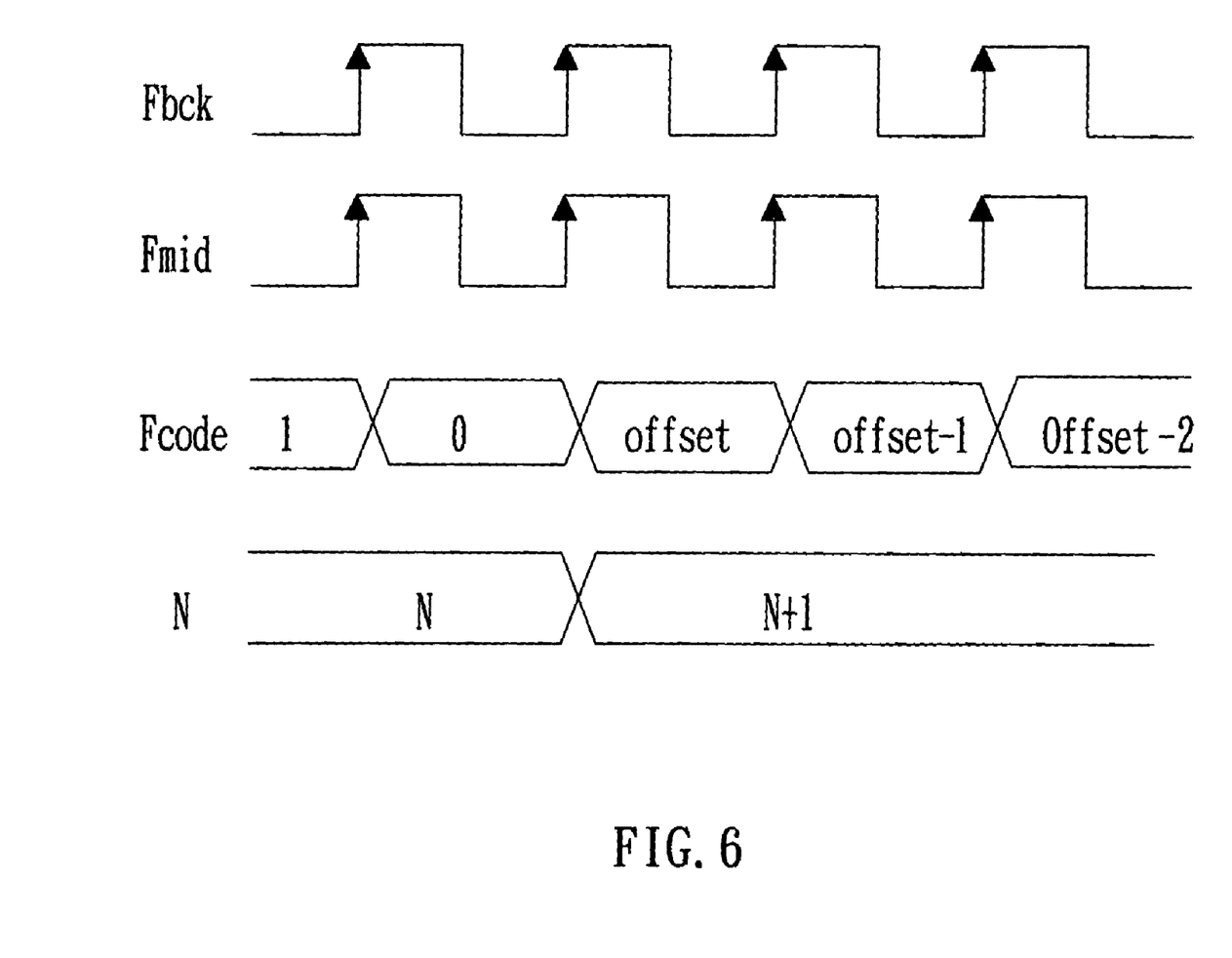
FIG. 6 is a schematic view of the timing of a signal $F_{code}$ of an accumulator of a primary circuit and a programmable feedback frequency divider having an N divisor of the secondary circuit when the circuit of the present invention is used for over clock.
Figure 7:
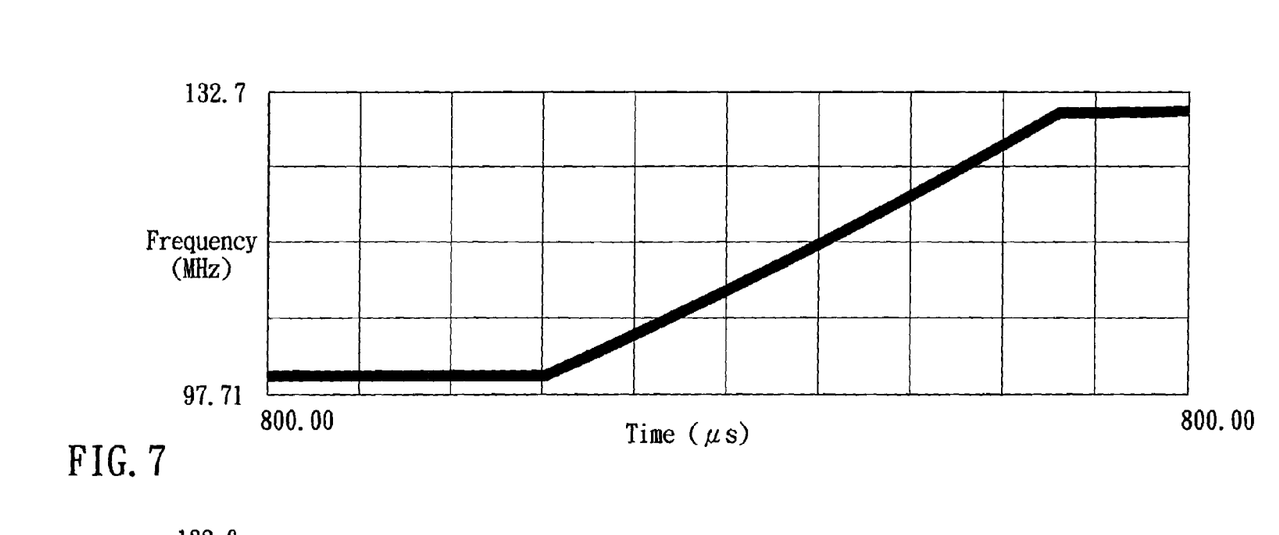
FIG. 7 is a schematic view of actually testing the over clock process when the spectrum of the circuit of the present invention is not spread.
Figure 8:
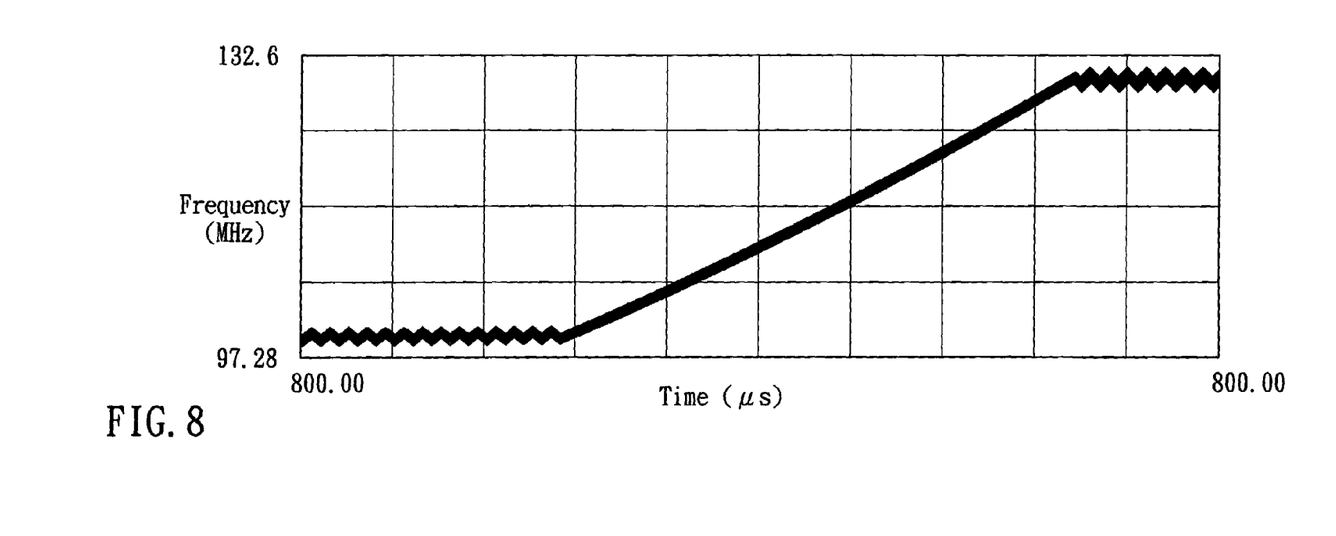
FIG. 8 is a schematic view of actually testing the over clock process when the spectrum of the circuit of the present invention is spread.

If the value of the control signal $F_{code}$ becomes zero and it is necessary to further raise the frequency of the output clock signal $F_{out}$, the divisor factor of the programmable feedback frequency divider 511 is added by one (for example, from N to N+1). Since the change of the divisor factor produces a phase error between the two input signals of the PFD 510, therefore it is necessary to carry out dynamic phase compensation. In other words, when the divisor factor of the programmable feedback frequency divider 511 is changed from N to N+1, the control data $F_{code}$ inputted to the accumulator 505 must be added by an offset value for eliminating the phase error between the two input signals detected by the PFD 510 and assure a continuous linearity of the frequency of the final output signal. Referring to FIG. 6 for the preferred embodiment used for an over clock processing, it shows a schematic view of the actual testing of the timing of the control signal $F_{code}$ inputted into the accumulator 505 and the divisor factor N of the programmable feedback frequency divider 511; wherein the change of the control signal $F_{code}$ and the divisor factor N value is controlled and completed by the over clock control circuit 507 according to the user setup to achieve the over clock function. The over clock process is demonstrated in FIGS. 7 and 8. The whole over clock process fully shows its linearity without any overcharge and maintains good phase noise performance.

When the preferred embodiment carries out spread spectrum process, the spread spectrum control circuit 506 produces a data $F_{ssc}$ required by the spread spectrum, and the over clock control circuit 507 produces a data $F_{over}$ according to the user setup, and then $F_{ssc}$ and $F_{over}$ are sent to the summation circuit 508. The summation circuit 508 will send a summation data $F_{code}$ to the accumulator 505. The carryout signal $C_0$ produced by the accumulator 505 controls the number of swallowed phases of the phase-swallow circuit 503, and selects a phase of the multi-phase clock signal so as to achieve the purpose of changing the output frequency.

In another preferred embodiment of the present invention, the divided-by-P frequency divider 515 varies according to the requirements of the design or can be omitted. The spread spectrum control circuit 506, the over clock control circuit 507, and the summation circuit 508 are combined into a control circuit, and the multi-phase clock generator 502 could be a phase locked loop (PLL), a delay locked loop (DLL) or a phase interpolation circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit for producing an output clock signal, comprising:
   a first circuit, for fractional-frequency dividing a frequency of a reference clock signal comprising:
      a multi-phase clock generator, for receiving the reference clock signal and producing a plurality of clock signals of the same frequency and different phases;
      a phase swallow circuit, for swallowing the phase of the plurality of clock signals according to a swallow control signal to generate a first clock signal;
      a control circuit for generating a control data and a divisor factor control data; and
      an accumulator, coupled to the phase swallow circuit and the control circuit, for producing the swallow control signal according to the control data; and
   a second circuit for multiplying a frequency of the first clock signal from said first circuit according to the divisor factor control data to generate the output clock signal.

2. The circuit of claim 1, the control circuit comprising:
   an over clock control circuit, for producing an over clock control data.

3. The circuit of claim 1, wherein said accumulator is a sigma-delta modulator.

4. The circuit of claim 1, wherein said multi-phase clock generator is one of a phase locked loop, a delay locked loop, and a phase interpolation circuit.

5. The circuit of claim 1, the control circuit comprising:
   an over clock control circuit, for producing said divisor factor control data.

6. The circuit of claim 5, wherein the over clock control circuit produces an over clock control data and the control circuit further comprises:
   a spread spectrum control circuit, for producing a spread spectrum control data; and
   a summation circuit, for receiving the spread spectrum control data and the over clock control data to produce the control data.

7. The circuit of claim 6, wherein said second circuit is one of a phase locked loop, a delay locked loop, and a phase interpolation circuit.

8. The circuit of claim 1, the second circuit comprising:
   a phase frequency detector for detecting phase difference between the first clock signal from said first circuit and an feedback clock signal, and generating a phase error signal;
   a charge pump for receiving the phase error signal from the phase frequency detector to generate a voltage control signal;
   a voltage controlled oscillator for outputting the output clock signal according to said voltage control signal; and
   a first frequency divider for receiving the output clock signal from said voltage controlled oscillator, and outputting said feedback clock signal.

9. The circuit of claim 8, wherein a divisor factor of said first frequency divider is determined by the divisor factor control data from said first circuit.

10. The circuit of claim 8, further comprising:
    a second frequency divider for dividing a frequency of the output clock signal from said voltage controlled oscillator.

11. A method for producing an output clock signal, comprising:
receiving a reference clock signal;
producing a plurality of clock signals of the same frequency and different phases according to the reference clock signal;
swallowing the phase of the plurality of clock signals according to a swallow control signal to generate a first clock signal;
generating a divisor factor control data; and
multiplying a frequency of the first clock signal according to the divisor factor control data to generate the output clock signal.

12. The method of claim 11, the multiplying step farther comprising:
detecting phase difference between the first clock signal and an feedback clock signal to generate a phase error signal;
outputting the output clock signal according to said phase error signal; and
dividing a frequency of the output clock signal according to the divisor factor control data to generate said feedback clock signal.

13. The method of claim 11, further comprising:
generating a control data; and
accumulating the control data to generate the swallow control signal.

14. The method of claim 13, wherein said accumulating-step is a sigma-delta modulating step.

15. The method of claim 13, farther comprising:
producing an over clock control data and a spread spectrum control data; and
adding the spread spectrum control data and the over clock control data to produce the control data.

16. The method of claim 15, wherein said first clock signal and said output clock signal are modulated by said spread spectrum control data such that both said first clock signal and said output clock signal have a spread spectrum characteristic.

17. The method of claim 15, wherein when the frequency of the output clock signal is increasing, the over clock control data decreases step by step.

18. The method of claim 15, wherein the divisor factor control data and the over clock control data are adjusted such that the output clock signal has a continuous linearity process.

19. A circuit for producing an output clock signal, comprising:
a control circuit for receiving a setting data, and generating a control signal and a divisor factor control signal according to the selling data, wherein the control circuit comprises an over clock control circuit for producing an over clock control data;
a first circuit for fractional-frequency dividing a frequency of a reference clock signal according to the control signal to generate a first clock signal; and
a second circuit for multiplying a frequency of the first clock signal from said first circuit according to the divisor factor control signal to generate the output clock signal.

20. The circuit of claim 19, wherein when the over clock control data is equal to zero value, the divisor factor control data is adjusted and the over clock control data is set to a predetermined offset value for eliminating the phase error between the output cock signal and the first clock signal.

21. The circuit of claim 19, wherein said over clock control circuit adjusts the divisor factor control data and the over clock control data such that the output clock signal has a continuous linearity process.

22. The circuit of claim 19, wherein the control signal comprises a spread spectrum control signal.

23. The circuit of claim 19, wherein the divisor factor control signal and the control signal are adjusted such that the output clock signal has a continuous linearity.

24. The circuit of claim 19, the control circuit further comprising:
a spread spectrum control circuit, for producing a spread spectrum control data; and
a summation circuit, for receiving the spread spectrum control data and the over clock control data to produce the control signal.

25. The circuit of claim 24, wherein said spread spectrum control data is a triangular waveform or a Lexmark waveform in time domain.

26. The circuit of claim 24, wherein said first clock signal and said output clock signal are modulated by said spread spectrum control data such that both said first clock signal and said output clock signal have a spread spectrum characteristic.

27. The circuit of claim 24, wherein when the frequency of the output clock signal is increasing, the over clock control data decreases step by step.

* * * * *